United States Patent
Ikari

(10) Patent No.: US 11,535,566 B2
(45) Date of Patent: Dec. 27, 2022

(54) PARAMAGNETIC GARNET-TYPE TRANSPARENT CERAMIC, MAGNETO-OPTICAL MATERIAL AND MAGNETO-OPTICAL DEVICE

(71) Applicant: SHIN-ETSU CHEMICAL CO., LTD., Tokyo (JP)

(72) Inventor: Masanori Ikari, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 856 days.

(21) Appl. No.: 16/413,337

(22) Filed: May 15, 2019

(65) Prior Publication Data
US 2019/0353939 A1 Nov. 21, 2019

(30) Foreign Application Priority Data
May 18, 2018 (JP) .............................. JP2018-096086

(51) Int. Cl.
*C30B 29/22* (2006.01)
*C04B 35/50* (2006.01)
(Continued)

(52) U.S. Cl.
CPC .............. *C04B 35/50* (2013.01); *C30B 29/22* (2013.01); *G02F 1/0036* (2013.01); *G02F 1/093* (2013.01)

(58) Field of Classification Search
CPC ................ C04B 35/50; C04B 35/6262; C04B 35/62645; C04B 35/6455; C04B 2235/3224; C04B 2235/3248; C30B 29/22; G02F 1/0036; G02F 1/093; C01G 19/006; C01G 23/003; C01G 25/006;
(Continued)

(56) References Cited

U.S. PATENT DOCUMENTS

| 7,166,162 | B2 | 1/2007 | Sekijima et al. |
| 9,030,739 | B2 | 5/2015 | Hatanaka et al. |
| 2004/0035357 | A1 | 2/2004 | Sekijima et al. |
| 2007/0238604 | A1* | 10/2007 | Tang ............... C04B 35/50 501/153 |

(Continued)

FOREIGN PATENT DOCUMENTS

| CN | 107619273 A | * 1/2018 |
| JP | 2002-293693 A | 10/2002 |

(Continued)

OTHER PUBLICATIONS

Akio Ikesue, Yan Lin Aung; Development of Optical Grade Ceramics as Faraday rotor material, Journal, American Ceramic Society, Apr. 2017 (Year: 2017).*

(Continued)

*Primary Examiner* — Stephone B Allen
*Assistant Examiner* — Rahman Abdur
(74) *Attorney, Agent, or Firm* — Birch, Stewart, Kolasch & Birch, LLP

(57) ABSTRACT

A paramagnetic garnet-type transparent ceramic is a sintered body of complex oxide represented by the following formula (1), comprising $SiO_2$ as a sintering aid in an amount of more than 0% by weight to 0.1% by weight or less, and has a linear transmittance of 83.5% or more at the wavelength of 1,064 nm for an optical path length of 25 mm:

$$(Tb_{1-x-y}Y_xSc_y)_3(Al_{1-z}Sc_z)_5O_{12} \qquad (1)$$

wherein $0.05 \leq x < 0.45$, $0 < y < 0.1$, $0.5 < 1-x-y < 0.95$, and $0.004 < z < 0.2$.

8 Claims, 2 Drawing Sheets

(51) Int. Cl.
*G02F 1/00* (2006.01)
*G02F 1/09* (2006.01)

(58) Field of Classification Search
CPC ...... C01G 27/006; C01G 35/006; G02B 1/02; G02B 27/28; C01P 2002/50; C01P 2002/76
USPC .......................................... 359/484; 117/84
See application file for complete search history.

(56) References Cited

U.S. PATENT DOCUMENTS

2010/0294939 A1* 11/2010 Kuntz .................... C04B 35/01
250/361 R
2016/0145765 A1 5/2016 Matsui et al.

FOREIGN PATENT DOCUMENTS

| JP | 3642063 B2 | 4/2005 |
|---|---|---|
| JP | 2008-7385 A | 1/2008 |
| JP | 4107292 B2 | 6/2008 |
| JP | 2011-213552 A | 10/2011 |
| JP | 2012082079 | * 4/2012 |
| JP | 5611329 B2 | 10/2014 |
| JP | 5935764 B2 | 6/2016 |

OTHER PUBLICATIONS

Aung et al., "Development of optical grade (TbxY1-x)3Al5O12 ceramics as Faraday rotator material"., Journal of American Ceramic Society, 100 (9), 4081-4087, (2017).

* cited by examiner

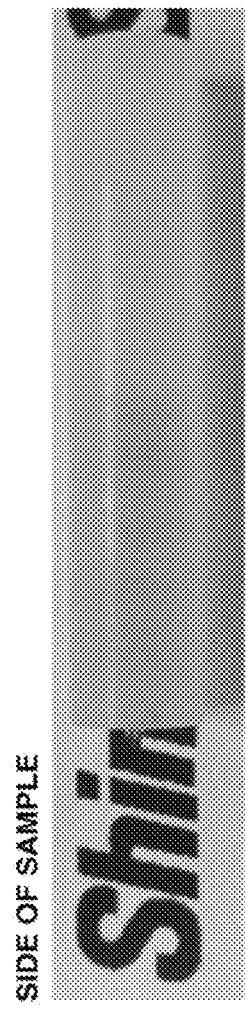
FIG.2A SIDE OF SAMPLE
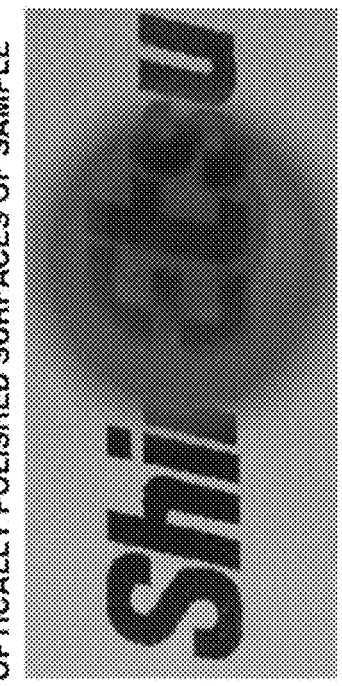
FIG.2B OPTICALLY POLISHED SURFACES OF SAMPLE

_US 11,535,566 B2_

PARAMAGNETIC GARNET-TYPE TRANSPARENT CERAMIC, MAGNETO-OPTICAL MATERIAL AND MAGNETO-OPTICAL DEVICE

CROSS-REFERENCE TO RELATED APPLICATION

This non-provisional application claims priority under 35 U.S.C. § 119(a) on Patent Application No. 2018-096086 filed in Japan on May 18, 2018, the entire contents of which are hereby incorporated by reference.

TECHNICAL FIELD

The present invention relates to a paramagnetic garnet-type transparent ceramic, and more particularly to a magneto-optical material made of a garnet-type transparent ceramic containing terbium, which is suitable for constituting a magneto-optical device such as an optical isolator, and to a magneto-optical device using the magneto-optical material.

BACKGROUND ART

In recent years, as high power of fiber laser has become possible, the spread of laser processing machines using fiber lasers is remarkable. Incidentally, as for a laser light source built in a laser processing machine, when light from the outside is input, a resonance state becomes unstable, and a phenomenon in which the oscillation state is disturbed occurs. Especially when the oscillated light is reflected by an optical system on the way and returns to the light source, the oscillation state is greatly disturbed. In order to prevent this, an optical isolator is usually provided in front of the light source, or the like.

The optical isolator is constituted by a Faraday rotator, a polarizer disposed on the light incident side of the Faraday rotator, and an analyzer disposed on the light emission side of the Faraday rotator. In addition, the Faraday rotator applies a magnetic field parallel to the traveling direction of the light to be utilized. At this time, the polarized wave component of the light rotates only in a certain direction regardless of forward or backward traveling in the Faraday rotator. Furthermore, the Faraday rotator is adjusted to a length that the polarized wave component of the light is rotated by exactly 45 degrees. Herein, when the polarization planes of the polarizer and the analyzer are shifted by 45 degrees in the rotation direction of the forward traveling light, the polarized waves of the forward traveling light coincides at the position of the polarizer and at the position of the analyzer, and the forward traveling light is transmitted. On the other hand, the polarized waves of the backward traveling light is rotated by 45 degrees in the direction opposite to the deviation angle direction of the polarization plane of the polarizer shifted by 45 degrees from the position of the analyzer.

Then, the polarization plane of the return light at the position of the polarizer is shifted by 45 degrees−(−45 degrees)=90 degrees from the polarization plane of the polarizer, and the return light cannot be transmitted. In this way, the optical isolator functions to transmit and emit the forward traveling light and block the return light traveling backward.

A TGG crystal ($Tb_3Ga_5O_{12}$) and a TSAG crystal (($Tb_{(3-x)}Sc_x$)$Sc_2Al_3O_{12}$) are conventionally known as materials used as a Faraday rotator constituting the above optical isolator (JP-A 2011-213552 (Patent Document 1) and JP-A 2002-293693 (Patent Document 2)). The TGG crystal is now widely used for standard fiber laser devices. Meanwhile, the Verdet constant of the TSAG crystal is said to be about 1.3 times that of the TGG crystal, and this is also a suitable material mounted in the fiber laser devices. However, since Sc is a very expensive raw material, the TSAG crystal is not employed due to the manufacturing costs.

Although the development of the TSAG crystal has been still continued as in JP-B 5611329 (Patent Document 3) and JP-B 5935764 (Patent Document 4), but none can achieve reduction in Sc usage so that the TSAG crystal is not widely used.

Other than the above, a TAG crystal ($Tb_3Al_5O_{12}$) has been known for a long time as a Faraday rotator with the Verdet constant greater than that of the TSAG. However, since the TAG crystal is an incongruent melting crystal, there is a restriction that a perovskite phase is first formed (precipitated) at a solid-liquid interface and then a TAG phase is formed (precipitated). In other words, the TAG crystal can be grown only in a state where the garnet phase and the perovskite phase are always mixedly present, and good-quality, large-size TAG crystal growth has not been realized.

JP-B 3642063 (Patent Document 5) and JP-B 4107292 (Patent Document 6) propose, as a means for suppressing this mixed crystal, a process for preferentially precipitating the perovskite phase, which is the initial phase, in a porous medium by making a polycrystalline raw material rod or a seed crystal for FZ growth porous. However, in reality, as the melted position moves, the position where the perovskite phase is likely to precipitate also moves.

Thus, even if only the interface of the seed crystal and the polycrystalline raw material rod was made porous, it was inherently impossible to suppress the precipitation of the perovskite phase completely.

Under such restrictions, JP-A 2008-7385 (Patent Document 7) has proposed a material for creating the oxide of the TAG composition by ceramics and giving translucency. The ceramics can be produced by sintering at a temperature lower than the melting point by 100° C. or more so that it is possible to clear the problem of incongruent melting, which has been the problem in the single crystal growth. The decomposition of the TAG actually begins at 1,840° C. or more. Thus, if sintering densification can be done to the highest theoretical density at this temperature or less, a transparent sintered body of the TAG single phase can be obtained.

Patent Document 7 discloses a process for producing a ceramic that has a garnet structure and is composed of terbium aluminum oxide, and the process comprises the steps of: compounding raw materials; calcining; crushing the calcined powder; forming; and firing, in which a TAG ceramic with high light transmittance can be created if the average particle size of the calcined powder after the crushing is 0.2 µm to 1.6 µm in the step of crushing the calcined powder, and the density after the forming is 3.26 g/cm$^3$ or more in the step of forming.

However, according to Patent Document 7, the translucency is extremely insufficient, and even the maximum linear transmittance with the thickness of 1.5 mm was only 35%. By the way, in a case where the TAG is utilized as a Faraday element such as an optical isolator, for example, the element length necessary for rotating the light by 45 degrees is about 15 mm for a 1.06 µm band laser, which is approximately ten times the length in the document. For the material with light transmittance of 35% with the thickness of 1.5 mm, if the element length thereof is elongated by ten times, the transmittance becomes less than 0.01%, that is, nearly zero, and the element does not function at all.

That is, even with a ceramic production process capable of suppressing the occurrence of different phases, the TAG of a practical level has not existed so far. Note that Patent Document 6 indicates that the Verdet constant increases as compared with the TAG when Ce is substituted for some Tb in the TAG crystal. As the Verdet constant increases, the element length necessary to rotate the incident light by 45 degrees can be shortened. Thus, the total absorbed amount is reduced. However, with the linear transmittance of 35% with the thickness of 1.5 mm, the 45 degree rotation thickness transmittance is less than 1% even if the element length is halved. This is far from practical use.

CITATION LIST

Patent Document 1: JP-A 2011-213552
Patent Document 2: JP-A 2002-293693
Patent Document 3: JP-B 5611329
Patent Document 4: JP-B 5935764
Patent Document 5: JP-13 3642063
Patent Document 6: JP-B 4107292
Patent Document 7: JP-A 2008-7385
Non-Patent Document 1: Yan Lin Aung, Akio Ikesue, Development of optical grade $(Tb_xY_{1-x})_3Al_5O_{12}$ ceramics as Faraday rotator material, J. Am. Ceram. Soc., 100(9), 4081-4087 (2017)

SUMMARY OF THE INVENTION

The present invention has been made in light of the above circumstances, and an object thereof is to provide a paramagnetic garnet-type transparent ceramic, which is a sintered body of paramagnetic garnet-type oxide containing terbium and yttrium and has a linear transmittance of 83.5% or more at a wavelength of 1,064 nm with the length of 25 mm, a magneto-optical material and a magneto-optical device using the magneto-optical material.

Incidentally, under the above situations, recently disclosed is a dense ceramic sintered body whose composition is $(Tb_xY_{1-x})_3Al_5O_{12}$ (x=0.5 to 1.0) and which has a higher extinction ratio than the existing TGG crystal (existing 35 dB has been improved to 39.5 dB or more) and can also reduce insertion loss (existing 0.05 dB has been improved to 0.01 to 0.05 dB) (Non-Patent Document 1). Since the material disclosed in Non-Patent Document 1 is ceramic at the outset, there is no precipitation of a perovskite different phase, which was the problem in the TGG crystal. Moreover, by substituting Y ions for some Tb ions, the loss can be further reduced. Thus, an extremely high-quality garnet-type Faraday rotator can be obtained by this material. However, when the inventors actually conducted the replication study, it was confirmed that the reproducibility is very poor and a high-quality ceramic sintered body with less insertion loss than the TGG crystal is hardly obtained.

Based on these findings, the inventor conducted intensive studies and achieved the present invention.

That is, the present invention provides the following paramagnetic garnet-type transparent ceramic, magneto-optical material and magneto-optical device.

1. A paramagnetic garnet-type transparent ceramic that is a sintered body of complex oxide represented by the following formula (1), comprising $SiO_2$ as a sintering aid in an amount of more than 0% by weight to 0.1% by weight or less, and has a linear transmittance of 83.5% or more at a wavelength of 1,064 nm for an optical path length of 25 mm:

$$(Tb_{1-x-y}Y_xSc_y)_3(Al_{1-z}Sc_z)_5O_{12} \quad (1)$$

wherein 0.05<x<0.45, 0<y<0.1, 0.5<1−x−y<0.95, and 0.004<z<0.2.

2. The paramagnetic garnet-type transparent ceramic according to 1, wherein a Verdet constant at the wavelength of 1,064 nm is 30 rad/(T·m) or more.
3. The paramagnetic garnet-type transparent ceramic according to 1 or 2, wherein a maximum change amount of a focal position by a thermal lens is 0.25 m or less when laser light with the wavelength of 1,064 nm is input thereto with a beam diameter of 1.6 mm and input power of 100 W, for the optical path length of 25 mm.
4. The paramagnetic garnet-type transparent ceramic according to any one of 1 to 3, wherein an extinction ratio at the wavelength of 1,064 nm for the optical path length of 25 mm is 40 dB or more as a Faraday rotator.
5. The paramagnetic garnet-type transparent ceramic according to any one of 1 to 4, wherein a volume concentration of a scattering source is 3 ppm or less.
6. A magneto-optical material made of the paramagnetic garnet-type transparent ceramic according to any one of 1 to 5.
7. A magneto-optical device configured by using the magneto-optical material according to 6.
8. The magneto-optical device according to 7, comprising the paramagnetic garnet-type transparent ceramic as the Faraday rotator, wherein the magneto-optical device is an optical isolator which comprises a polarization material in front of and behind the Faraday rotator on an optic axis and is usable at a wavelength band of 0.9 μm or more to 1.1 μm or less.

Advantageous Effects of the Invention

According to the present invention, it is possible to provide a truly practical paramagnetic garnet-type oxide transparent ceramic material, which is paramagnetic garnet-type oxide containing terbium and yttrium, has truly practical transparency applicable even to a high power laser device, and is easily scaled up for a ceramic sintered body.

BRIEF DESCRIPTION OF THE DRAWINGS

FIGS. 2A and 2B are photographs showing the optical appearance checking results of the sample in Example 1, in which
FIG. 2A is the appearance of the side of the sample,
and FIG. 2B is the appearance of the optically polished surface of the sample.

DESCRIPTION OF THE PREFERRED EMBODIMENT

Figure 1:
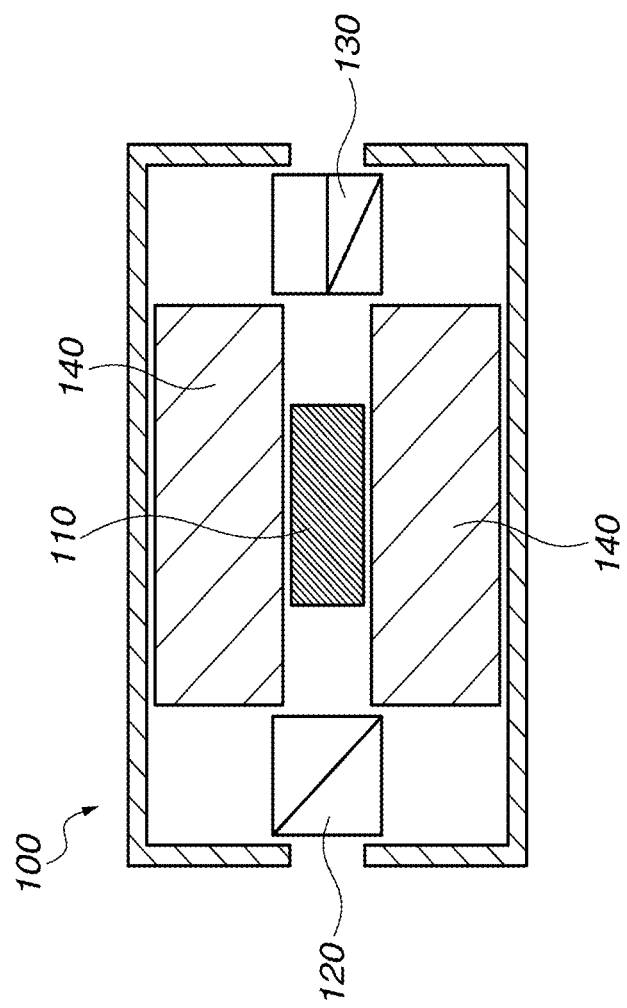
FIG. 1 is a schematic cross-sectional view showing a configuration example of an optical isolator using a magneto-optical material according to the present invention as a Faraday rotator.

Paramagnetic Garnet-Type Transparent Ceramic
Hereinafter, a paramagnetic garnet-type transparent ceramic according to the present invention is described.

The transparent ceramic material according to the present invention is a paramagnetic garnet-type transparent ceramic that is a sintered body of complex oxide represented by the following formula (1), comprising $SiO_2$ as a sintering aid in an amount of more than 0% by weight to 0.1% by weight or less, and has a linear transmittance of 83.5% or more at a wavelength of 1,064 nm for an optical path length of 25 mm:

$$(Tb_{1-x-y}Y_xSc_y)_3(Al_{1-z}Sc_z)_5O_{12} \qquad (1)$$

wherein $0.05 \leq x < 0.45$, $0 < y < 0.1$, $0.5 < 1-x-y < 0.95$, and $0.004 < z < 0.2$.

In the formula (1), terbium (Tb) is the material having the greatest Verdet constant among the paramagnetic elements excluding iron (Fe) and is the element most suitable to be used for an optical isolator at a wavelength region of 1,064 nm since the material is completely transparent in this wavelength region especially when terbium is contained in the oxide having a garnet structure.

Yttrium (Y) has an ionic radius shorter than that of terbium by about 2% and is a material which can form a garnet phase more stably than a perovskite phase and reduce residual strain in the crystallite when yttrium (Y) is combined with aluminum to form complex oxide. This can prevent scattering due to different phases, deterioration of the extinction ratio due to the internal stress, and f-f transition absorption of terbium ions. Thus, yttrium (Y) is an important constituent element in the present invention. Moreover, by substituting yttrium ions for some of terbium ions, the sinterability (combination reactions and sharp phase changes during the temperature rising, a sharp change in specific gravity associated therewith) is leveled out so that the pore residual amount in the ceramic sintered body can be limited to 1 ppm or less. Thus, yttrium (Y) is a constituent element suitable in the present invention.

Aluminum (Al) is the material having the shortest ionic radius among trivalent ions that can stably exist in oxide having a garnet structure, and is the element that can minimize the lattice constant of the terbium-containing paramagnetic garnet-type oxide. If the lattice constant of the garnet structure can be decreased without changing the terbium content, the Verdet constant per unit length can be increased, which is preferable. The Verdet constant of the actual TAG is improved to 1.25 to 1.5 times that of a TGG. Therefore, even when a relative concentration of terbium is lowered by substituting the yttrium ions for some of the terbium ions, the Verdet constant per unit length can be kept equal to or slightly lower than that of the TGG. Thus, these are constituent elements suitable in the present invention.

Scandium (Sc) is a material that has an intermediate ionic radius and can be solid solution in both the terbium site and part of the aluminum site in the oxide having a garnet structure. Scandium (Sc) is also a buffer material that can be solid solution by adjusting the distribution ratio thereof to the rare earth site composed of terbium and yttrium and the aluminum site so as to exactly match the stoichiometric ratio and thereby minimize the generation energy of the crystallite when the compounding ratio of the rare earth elements of terbium and yttrium to aluminum is deviated from the stoichiometric ratio due to variation at the time of weighing. Sc is also an element that can limit the abundance of the alumina different phase in the garnet parent phase to 1 ppm or less and limit the abundance of the perovskite-type different phase in the garnet parent phase to 1 ppm or less. Thus, Sc is an indispensable element in the present invention.

In the formula (1), the range of x is $0.05 \leq x < 0.45$, preferably $0.1 \leq x \leq 0.4$, and more preferably $0.2 \leq x \leq 0.35$. If x is in this range, the perovskite-type different phase can be reduced to a level that cannot be detected by X-ray diffraction (XRD) analysis. Furthermore, the abundance of the perovskite-type different phase (which has a typical size of 1 μm to 1.5 μm in diameter and is granular appearing to be colored by light brown) in a viewing field of 150 μm×150 μm by optical microscope observation is one or less, which is preferable. The abundance of the perovskite-type different phase at this time in the garnet parent phase is 1 ppm or less. Similarly, if x is in the above range, the amount of pores (which have a typical size of 0.5 μm to 2.0 μm in diameter and become spherical gaps when subjected to HIP treatment) remaining in the ceramic sintered body in a viewing field of 150 μm×150 μm by optical microscope observation is one or less in abundance, which is preferable. The abundance of the pores at this time in the garnet parent phase is 1 ppm or less.

When x is less than 0.05, the effect of substituting yttrium for some of terbium cannot be obtained, and this is not substantially different from the conditions for creating the TAG. Thus, it becomes difficult to stably produce a high-quality ceramic sintered body with low scattering and low absorption, which is unpreferable. Moreover, when x is 0.45 or more, the Verdet constant at a wavelength of 1,064 nm becomes less than 30 rad/(T·m), which is unpreferable. Furthermore, if the relative concentration of terbium is excessively diluted, the overall length necessary to rotate laser light with a wavelength of 1,064 nm by 45 degrees becomes long, exceeding 25 mm. This makes the production difficult, which is unpreferable.

In the formula (1), the range of y is $0 < y < 0.1$, preferably $0 < y < 0.08$, more preferably $0.002 \leq y \leq 0.07$, and still more preferably $0.003 \leq y \leq 0.06$. If y is in this range, the perovskite-type different phase can be reduced to a level that cannot be detected by X-ray diffraction (XRD) analysis. Furthermore, the abundance of the perovskite-type different phase (which has a typical size of 1 μm to 1.5 μm in diameter and is granular appearing to be colored by light brown) in a viewing field of 150 μm×150 μm by optical microscope observation is one or less, which is preferable. The abundance of the perovskite-type different phase at this time in the garnet parent phase is 1 ppm or less.

When y=0, the perovskite-type different phase is highly likely to precipitate, which is unpreferable. Moreover, when y is 0.1 or more, yttrium is substituted for some of terbium, and further scandium is substituted for some of terbium while the effect of suppressing the precipitation of the perovskite-type different phase is saturated and unchanged. As a result, the solid solution concentration of terbium is unnecessarily lowered, thereby decreasing the Verdet constant. This is unpreferable. Furthermore, scandium is expensive as a raw material, so unnecessary excessive doping of scandium is unpreferable from the viewpoint of the production costs.

In the formula (1), the range of $1-x-y$ is $0.5 < 1-x-y < 0.95$, preferably $0.55 \leq 1-x-y < 0.95$, and more preferably $0.6 \leq 1-x-y < 0.95$. If $1-x-y$ is in this range, a large Verdet constant can be secured as well as high transparency can be obtained at a wavelength of 1,064 nm.

In the formula (1), the range of z is $0.004 < z < 0.2$, preferably $0.004 < z < 0.16$, more preferably $0.01$ z $0.15$, and still more preferably $0.03$ z $0.15$. If z is in this range, the perovskite-type different phase cannot be detected by XRD analysis.

Furthermore, the abundance of the perovskite-type different phase (which has a typical size of 1 μm to 1.5 μm in diameter and is granular appearing to be colored by light brown) in a viewing field of 150 μm×150 μm by optical microscope observation is one or less, which is preferable. The abundance of the perovskite-type different phase at this time in the garnet parent phase is 1 ppm or less.

When z is 0.004 or less, the perovskite-type different phase is highly likely to precipitate, which is unpreferable. Moreover, when z is 0.2 or more, the value of y, that is, the substitution ratio of scandium for terbium also increases in conjunction with the increase in the value of z while the effect of suppressing the precipitation of the perovskite-type different phase is saturated and unchanged. As a result, the solid solution concentration of terbium is unnecessarily lowered, thereby decreasing the Verdet constant. This is unpreferable. Furthermore, scandium is expensive as a raw material, so unnecessary excessive doping of scandium is unpreferable from the viewpoint of the production costs.

The paramagnetic garnet-type transparent ceramic of the present invention contains as a main component the complex oxide represented by the aforementioned formula (1). Moreover, as a subcomponent, $SiO_2$ which serves as a sintering aid is contained in a range with the upper limit of 0.1% by weight or less. When a trace amount of $SiO_2$ is added as a sintering aid, the precipitation of the perovskite-type different phase is suppressed. Thus, the transparency of the paramagnetic garnet-type transparent ceramic is further improved. Furthermore, the added trace amount of $SiO_2$ is vitrified during sintering at 1,400° C. or more, resulting in a liquid phase sintering effect. Thus, it is possible to promote the densification of the garnet-type ceramic sintered body. However, if $SiO_2$ is added in an amount of 0.1% by weight or more, the maximum change amount of the focal position by the thermal lens exceeds 0.25 m when the paramagnetic garnet-type transparent ceramic with a length (optical path length) of 25 mm is irradiated with laser beams of 100 W and a wavelength of 1,064 nm.

Incidentally, "containing as a main component" means that 90% by weight or more of the complex oxide represented by the aforementioned formula (1) is contained. The complex oxide content, in which the complex oxide is represented by the formula (1), is preferably 99% by weight or more, more preferably 99.9% by weight or more, still more preferably 99.99% by weight or more, and particularly preferably 99.999% by weight or more.

The paramagnetic garnet-type transparent ceramic of the present invention is composed of the above main component and subcomponent, but may further contain other elements. Typical examples of other elements include rare earth elements, such as lutetium (Lu) and cerium (Ce), or various impurities such as sodium (Na), calcium (Ca), magnesium (Mg), phosphorus (P), tungsten (W), tantalum (Ta) and molybdenum (Mo).

The other element content is preferably 10 parts by weight or less, more preferably 0.1 parts by weight or less, and particularly preferably 0.001 part by weight or less (substantially zero) when the total amount of Tb and Y is defined as 100 parts by weight.

The paramagnetic garnet-type transparent ceramic of the present invention exhibits a colorless transparent appearance and has a linear transmittance of 83.5% or more at a wavelength of 1,064 nm for an optical path length of 25 mm. Note that, in the present invention, "linear transmittance" means a ratio of the intensity of the light with a target wavelength after the light is transmitted through a transparent ceramic sample when transmission spectrum (the intensity of the light) for the target wavelength measured in a blank (space) state where the sample is not placed in the measurement optical path is defined as 100%. That is, when the intensity of the light with a target wavelength (the intensity of the incident light) measured in the blank state is defined as $I_0$ and the intensity of the light after the light is transmitted through the transparent ceramic sample is defined as I, the linear transmittance can be expressed as $I/I_0 \times 100$ (%).

In the paramagnetic garnet-type transparent ceramic of the present invention, the Verdet constant at a wavelength of 1,064 nm is preferably 30 rad/(T·m) or more, and more preferably 36 rad/(T·m) or more. When the Verdet constant is 36 rad/(T·m) or more, the substitution for the existing TGG single crystal material can be performed without changing the designs of the parts, which is convenient and preferable.

Moreover, in the paramagnetic garnet-type transparent ceramic of the present invention, the maximum change amount of the focal position by the thermal lens is preferably 0.25 m or less when the laser light with a wavelength of 1,064 nm is input thereto with a beam diameter of 1.6 mm and input power of 100 W, for an optical path length of 25 mm. If the maximum change amount of the focal position by the thermal lens under certain incident power is less than 0.3 in, the paramagnetic garnet-type transparent ceramic of the present invention can be mounted in the system for the incident power, that is, the thermal lens characteristics meet the criteria. Since the paramagnetic garnet-type transparent ceramic of the present invention can manage the thermal lens to less than 0.3 m (especially, 0.25 m or less) at high power incidence of 100 W, the material thereof can be substantially employed for a high power laser system for 100 W.

The paramagnetic garnet-type transparent ceramic of the present invention preferably has an extinction ratio of 40 dB or more at a wavelength of 1,064 nm for an optical path length of 25 mm as a Faraday rotator (as a single ceramic element). In the garnet composition range of the present invention, material defects, such as strain and point defects, are drastically reduced. Thus, it is possible to stably manage the extinction ratio of 40 dB or more at a wavelength of 1,064 nm for an optical path length of 25 mm as a Faraday rotator (single ceramic element). In addition, the paramagnetic garnet-type transparent ceramic of the present invention has a volume concentration of the scattering sources of preferably 3 ppm or less, more preferably 2 ppm or less, and still more preferably 1 ppm or less. Note that the volume concentration of the scattering sources is the abundance (volume fraction) of the perovskite-type and alumina-type different phases (described above) with a diameter of 0.5 to 3 μm and pores, which would serve as scattering sources of the incident light, in the garnet parent phase volume.

Process for Producing Paramagnetic Garnet-Type Transparent Ceramic

[Material]

As a raw material used in the present invention, a metal powder composed of terbium, yttrium, scandium and aluminum, an aqueous solution of nitric acid, sulfuric acid, uric acid and the like, an oxide powder of the above elements, or the like can be suitably utilized. Moreover, the purity of the raw material is preferably 99.9% by weight or more, and particularly preferably 99.99% by weight or more.

Predetermined amounts of these elements are weighed so as to become the composition corresponding to the formula (1), further mixed together with tetraethyl orthosilicate (TEOS), which becomes a sintering aid $SiO_2$ by subsequent firing, and then fired to obtain a fired raw material mainly composed of cubic garnet-type oxide with desired configuration. At this time, TEOS is added so that the sintering aid $SiO_2$ content becomes more than 0% by weight to 0.1% by weight or less. Moreover, the firing temperature at this time is a temperature of preferably 950° C. or more and lower than the sintering temperature for the step performed thereafter, and more preferably a temperature of 1,100° C. or more and lower than the sintering temperature for the step performed thereafter. Note that "mainly composed of" as used herein indicates that the main peak obtained from the powder X-ray diffraction result of the fired raw material is of a diffraction peak derived from the garnet structure. Note that, when the abundance of the perovskite-type different phase in the garnet parent phase is 1 ppm or less, substantially only the garnet single phase pattern is detected for the powder X-ray diffraction patterns.

Next, the resulting fired raw material is crushed into raw material powder.

Note that a ceramic is finally produced by using the garnet-type oxide powder with desired configuration, but the shape of the powder at that time is not particularly limited, and, for example, an angular, spherical or tabular powder can be suitably utilized. Furthermore, even a powder that is secondarily coagulated can be suitably utilized, and even a granular powder obtained by granulation by granulation treatment such as spray-drying treatment can be suitably utilized. In addition, the step of preparing these raw material powders is not particularly limited. A raw material powder created by a coprecipitation method, a crushing method, a spray-pyrolysis method, a sol-gel method, an alkoxide hydrolysis method, or any other synthesis method can be suitably utilized. Further, the resulting raw material powder may be treated by a wet ball mill, a bead mill, a jet mill, a dry jet mill, a hammer mill or the like as appropriate.

Various organic additives may be added to the garnet-type oxide powder raw material used in the present invention for the purpose of quality stability and yield improvement in the subsequent step of producing the ceramic. In the present invention, these are also not particularly limited. That is, various dispersants, binders, lubricants, plasticizers and the like can be suitably utilized. However, for these organic additives, it is preferable to select a high-purity type free of unnecessary metal ions.

[Production Steps]

In the present invention, the above raw material powder is pressed into a predetermined shape, and then degreased and sintered thereafter to create a densified sintered body with a relative density of at least 95% or more. It is preferable to perform a hot isostatic pressing (HIP) treatment as a subsequent step. Note that, if the hot isostatic pressing (HIP) treatment is directly conducted, the paramagnetic garnet-type transparent ceramic is reduced, and slight oxygen deficiency occurs. Therefore, it is preferable to recover the oxygen deficiency by performing a slight oxidation HIP treatment or an annealing treatment in an oxidizing atmosphere after the HIP treatment. Accordingly, a transparent garnet-type oxide ceramic without defect absorption can be obtained.

(Forming)

In the production process of the present invention, a common pressing step can be suitably utilized. That is, it is possible to suitably utilize a common uniaxial pressing step, in which the raw material is packed in a mold and pressurized from a certain direction, a cold isostatic pressing (CIP) step or a warm isostatic pressing (WIP) step, in which the raw material is placed and sealed in a deformable waterproof container and applied hydrostatic pressure. Note that the applied pressure is not particularly limited and should be adjusted as appropriate while the relative density of the resulting compact is checked. For example, if the applied pressure is managed in a pressure range of about 300 MPa or less, which can be handled by a commercially available CIP device or WIP device, the manufacturing costs can be suppressed. Alternatively, a hot pressing step, a discharging plasma sintering step, a microwave heating step, or the like, in which not only the forming step but also the sintering are carried out at once, can also be suitably utilized at the time of forming. Moreover, it is also possible to create a compact by a slip casting method instead of a pressing method. By optimizing the combination of the shape and size of the oxide powder, which is the starting material, and various organic additives, forming methods, such as pressure casting, centrifugal casting and extrusion forming, can also be employed.

(Degreasing)

In the production process of the present invention, a common degreasing step can be suitably utilized. That is, it is possible to undergo a temperature rising degreasing step using a heating furnace. Moreover, the type of the atmosphere gas at this time is also not particularly limited, and air, oxygen, hydrogen, and the like can be suitably utilized. The degreasing temperature is also not particularly limited. However, if a raw material mixed with an organic additive is used, it is preferable to raise the temperature to a temperature at which the organic component can be decomposed and eliminated.

(Sintering)

In the production process of the present invention, a common sintering step can be suitably utilized. That is, a heat sintering step, such as a resistance heating method and an induction heating method, can be suitably utilized. The atmosphere at this time is not particularly limited, and it is possible to sinter under various atmospheres of inert gas, oxygen gas, hydrogen gas, helium gas, and the like, or also under reduced pressure (in vacuum). However, since it is preferable to prevent the occurrence of oxygen deficiency at the end, an oxygen gas atmosphere and a reduced pressure oxygen gas atmosphere are exemplified as more preferable atmospheres.

The sintering temperature in the sintering step of the present invention is preferably 1,500 to 1,780° C., and particularly preferably 1,550 to 1,750° C. When the sintering temperature is in this range, densification is promoted while the precipitation of different phases is suppressed, which is preferable.

The sintering retention time in the sintering step of the present invention is sufficient for about several hours, but the relative density of the sintered body must be densified to at least 95% or more. When the sintering retention time is long, ten hours or longer, and the relative density of the sintered body is densified to 99% or more, the final transparency is improved, which is more preferable.

(Hot Isostatic Pressing (HIP))

In the production process of the present invention, it is possible to further provide an additional hot isostatic pressing (HIP) treatment step after the sintering step.

Note that, as for the type of the pressurized gas medium at this time, inert gas such as argon and nitrogen, or $Ar-O_2$ can be suitably utilized. The pressure applied by the pressurized gas medium is preferably 50 to 300 MPa, and more preferably 100 to 300 MPa. If the pressure is less than 50 MPa, the transparency improving effect may not be obtained. If the pressure exceeds 300 MPa, no further transparency improvement is obtained even when the pressure is increased. Moreover, the load applied to the device becomes excessive, and the device may be damaged. It is convenient and preferable that the applied pressure be 196 MPa or less, which can be handled by a commercially available HIP device.

Moreover, the treatment temperature (predetermined retention temperature) at that time is set within the range from 1,000 to 1,780° C., and preferably from 1,100 to 1,730° C. If the heat treatment temperature exceeds 1,780° C., oxygen deficiency is likely to occur, which is unpreferable. Furthermore, if the heat treatment temperature is less than 1,000° C., the effect of improving transparency of the sintered body is hardly obtained. Note that the retention time of the heat treatment temperature is not particularly limited. However, if the heat treatment temperature is retained for a long time, oxygen deficiency is likely to occur, which is unpreferable. Typically, the retention time is preferably set within the range from one to three hours.

Note that the heater material, the heat insulating material and the treatment container subjected to the HIP treatment are not particularly limited, but graphite, or molybdenum (Mo), tungsten (W), and platinum (Pt) can be suitably utilized, and yttrium oxide and gadolinium oxide can also be further suitably utilized as the treatment container. When the treatment temperature is 1,500° C. or less in particular, platinum (Pt) can be used as the heater material, the heat insulating material and the treatment container, and the pressurized gas medium can be $Ar-O_2$. Thus, the occurrence of oxygen deficiency during the HIP treatment can be prevented, which is preferable. When the treatment temperature exceeds 1,500° C., graphite is preferable as the heater material and the heat insulating material. In this case, one of graphite, molybdenum (Mo) or tungsten (W) is selected as the treatment container, and one of yttrium oxide or gadolinium oxide is selected as a double container inside the treatment container. Then, if an oxygen release material is packed in the container, the occurrence amount of oxygen deficiency during the HIP treatment can be suppressed to the minimum, which is preferable.

(Annealing)

In the production process of the present invention, oxygen deficiency occurs in the resulting transparent ceramic sintered body after the HIP treatment is finished, and the transparent ceramic sintered body may exhibit a subtle light gray appearance. In that case, it is preferable to perform oxygen annealing treatment (oxygen deficiency recovery treatment) under an oxygen atmosphere at the HIP treatment temperature or less, typically 1,000 to 1,500° C. The retention time in this case is not particularly limited, but is preferably selected within a time period which is not less than a time sufficient for oxygen deficiency to recover and does not waste electricity cost due to unnecessarily long treatment. By this oxygen annealing treatment, even the transparent ceramic sintered bodies, which have exhibited a subtle light gray appearance by the HIP treatment step, can be all paramagnetic garnet-type transparent ceramic bodies which are colorless and transparent without defect absorption.

(Optical Polishing)

In the production process of the present invention, it is preferable to optically polish both end faces, which are on the optically utilizing axis, of the paramagnetic garnet-type transparent ceramic that has undergone the above series of production steps. The optical surface accuracy at this time is preferably $\lambda/2$ or less and particularly preferably $\lambda/8$ or less, when the measurement wavelength=633 nm. Note that the optical loss can be further reduced by forming antireflection films as appropriate on the optically polished surfaces.

As described above, it is possible to provide a ceramic transparent sintered body that is the paramagnetic garnet-type oxide containing terbium and yttrium and has a linear transmittance of 83.5% or more at a wavelength of 1,064 nm for a length (optical path length) of 25 mm. Moreover, it is possible to provide a magneto-optical material which preferably has a Verdet constant of 30 rad/(T·m) or more at a wavelength of 1,064 nm, preferably has the maximum change amount of the focal position by the thermal lens of 0.25 m or less when the laser light with a wavelength of 1,064 nm is input thereto with a beam diameter of 1.6 mm and input power of 100 W for an optical path length of 25 mm, and more preferably has an extinction ratio of 40 dB or more at a wavelength of 1,064 nm for an optical path length of 25 mm as a Faraday rotator (single ceramic element).

[Magneto-Optical Device]

Furthermore, since the paramagnetic garnet-type transparent ceramic of the present invention is presumed to be utilized as a magneto-optical material, it is preferable to apply a magnetic field to the paramagnetic garnet-type transparent ceramic parallel to the optical axis thereof and then set a polarizer and an analyzer such that their optical axes are shifted from each other by 45 degrees, thereby constituting a magneto-optical device to be utilized. That is, the magneto-optical material according to the present invention is suitable for magneto-optical device applications and is suitably used as a Faraday rotator of an optical isolator at a wavelength band of 0.9 to 1.1 µm in particular.

FIG. 1 is a schematic cross-sectional view showing one example of an optical isolator which is an optical device having, as an optical element, a Faraday rotator made of the magneto-optical material according to the present invention. In FIG. 1, an optical isolator 100 includes a Faraday rotator 110 made of the magneto-optical material according to the present invention, and a polarizer 120 and an analyzer 130, which are polarization materials, are provided in front of and behind the Faraday rotator 110, respectively. Further, in the optical isolator 100, it is preferable that the polarizer 120, the Faraday rotator 110 and the analyzer 130 be disposed in this order, and a magnet 140 be placed on at least one of the side faces thereof.

In addition, the above optical isolator 100 can be suitably utilized for industrial fiber laser devices. That is, the optical isolator 100 is suitable to prevent the reflected light of the laser light emitted from a laser light source from returning to the light source to cause unstable oscillation.

EXAMPLES

Hereinafter, the present invention is more specifically described with reference to Examples and Comparative Examples, but the present invention is not limited to the Examples.

Examples 1 to 11, Comparative Examples 1 to 9

Terbium oxide powder, yttrium oxide powder, scandium oxide powder manufactured by Shin-Etsu Chemical Co., Ltd., and aluminum oxide powder manufactured by Taimei Chemical Co., Ltd. were obtained. Moreover, a liquid of tetraethyl orthosilicate (TEOS) manufactured by Kishida Chemical Co., Ltd. was obtained. The purity was 99.95% by weight or more for all the powder raw materials and 99.999% by weight or more for the liquid raw material.

A total of 20 kinds of oxide raw materials, which become the final composition shown in Table 1, were created by using the above raw materials and adjusting the mixing ratios.

That is, mixed powders were prepared by weighing such that the numbers of moles of terbium, yttrium, aluminum and scandium are the respective mole fractions of the respective compositions in Table 1. Subsequently, TEOS was weighed and added to each raw material so that the addition amount thereof became the % by weight in $SiO_2$ conversion in Table 1.

Then, dispersion and mixing treatment was carefully performed in ethanol in an alumina ball mill device, preventing the contamination with each other. The treatment time was 15 hours. Thereafter, a spray-drying treatment was performed to create granular raw materials all having an average grain size of 20 μm.

Then, these powders were put in an yttria crucible and subjected to firing treatment in a high-temperature muffle furnace at 1,100° C. for a retention time of three hours to obtain fired raw materials with the respective compositions. Each resulting fired raw material was subjected to diffraction pattern analysis (XRD analysis) with a powder X-ray diffractometer manufactured by PANalytical. From the comparison between the reference data and the measured data of the X-ray diffraction patterns, the crystal systems of the samples were identified. In most cases (in the cases of Oxide Raw Materials No. 1 to 11, 14 to 18, and 20), only the peak of the garnet single phase (cubic crystal) was detected. In the cases of Oxide Raw Materials No. 12, 13 and 19, a weak peak of a perovskite different phase was detected besides the peak pattern of the garnet phase.

The above results are summarized in Table 1.

Each resulting sintered body was placed in a carbon heater HIP furnace and subjected to HIP treatment under the conditions of Ar, 200 MPa, 1,600° C. and two hours. Almost no graying (oxygen deficiency absorption) was confirmed in appearance of each resulting sintered body. However, just in case, each resulting ceramic sintered body was subjected to an annealing treatment in an oxygen atmosphere furnace for four hours at 1,300° C. to recover oxygen deficiency while performing lot management. Thus, a total of 20 types of sintered bodies of Examples and Comparative Examples were prepared.

Next, each resulting ceramic sintered body was ground and polished so as to have a diameter of 5 mm and a length of 25 mm, and both optical end faces of each sample were subjected to final optical polishing with an optical surface accuracy of λ/8 (when measurement wavelength λ=633 nm).

The linear transmittance, the extinction ratio, and the volume concentration of the scattering sources of each of the samples obtained as described above were measured as below.

(Method for Measuring Linear Transmittance)

The linear transmittance was measured with the intensity of the light, which had a wavelength of 1,064 nm and was transmitted with a beam diameter of 1 to 3 mmφ by an optical system internally manufactured using a light source

TABLE 1

| Oxide Raw Material No. | Composition | Sintering Aid $SiO_2$ (wt %) | XRD Analysis |
| --- | --- | --- | --- |
| 1 | $(Tb_{0.949}Y_{0.041}Sc_{0.01})_3(Al_{0.975}Sc_{0.025})_5O_{12}$ | 0.01 | Garnet |
| 2 | $(Tb_{0.899}Y_{0.091}Sc_{0.01})_3(Al_{0.975}Sc_{0.025})_5O_{12}$ | 0.01 | Garnet |
| 3 | $(Tb_{0.799}Y_{0.191}Sc_{0.01})_3(Al_{0.975}Sc_{0.025})_5O_{12}$ | 0.01 | Garnet |
| 4 | $(Tb_{0.699}Y_{0.291}Sc_{0.01})_3(Al_{0.975}Sc_{0.025})_5O_{12}$ | 0.01 | Garnet |
| 5 | $(Tb_{0.599}Y_{0.391}Sc_{0.01})_3(Al_{0.975}Sc_{0.025})_5O_{12}$ | 0.01 | Garnet |
| 6 | $(Tb_{0.799}Y_{0.191}Sc_{0.01})_3(Al_{0.975}Sc_{0.025})_5O_{12}$ | 0.09 | Garnet |
| 7 | $(Tb_{0.598}Y_{0.4}Sc_{0.002})_3(Al_{0.995}Sc_{0.005})_5O_{12}$ | 0.05 | Garnet |
| 8 | $(Tb_{0.73}Y_{0.2}Sc_{0.07})_3(Al_{0.85}Sc_{0.15})_5O_{12}$ | 0.006 | Garnet |
| 9 | $(Tb_{0.791}Y_{0.119}Sc_{0.09})_3(Al_{0.8}Sc_{0.2})_5O_{12}$ | 0.01 | Garnet |
| 10 | $(Tb_{0.595}Y_{0.39}Sc_{0.015})_3(Al_{0.965}Sc_{0.035})_5O_{12}$ | 0.02 | Garnet |
| 11 | $(Tb_{0.935}Y_{0.05}Sc_{0.015})_3(Al_{0.965}Sc_{0.035})_5O_{12}$ | 0.03 | Garnet |
| 12 | $(Tb)_3(Al)_5O_{12}$ | 0.05 | Garnet + Perovskite |
| 13 | $(Tb_{0.8}Y_{0.2})_3(Al_{0.996}Sc_{0.004})_5O_{12}$ | 0.05 | Garnet + Perovskite |
| 14 | $(Tb_{0.8}Y_{0.2})_3(Al)_5O_{12}$ | 0.08 | Garnet |
| 15 | $(Tb_{0.6}Y_{0.4})_3(Al)_5O_{12}$ | 0.08 | Garnet |
| 16 | $(Tb_{0.989}Y_{0.001}Sc_{0.01})_3(Al_{0.975}Sc_{0.025})_5O_{12}$ | 0.02 | Garnet |
| 17 | $(Tb_{0.499}Y_{0.491}Sc_{0.01})_3(Al_{0.975}Sc_{0.025})_5O_{12}$ | 0.03 | Garnet |
| 18 | $(Tb_{0.799}Y_{0.191}Sc_{0.01})_3(Al_{0.975}Sc_{0.025})_5O_{12}$ | 0.2 | Garnet |
| 19 | $(Tb_{0.699}Y_{0.291}Sc_{0.01})_{3.02}(Al_{0.975}Sc_{0.025})_{4.98}O_{12}$ | 0.01 | Garnet + Perovskite |
| 20 | $(Tb_{0.5}Y_{0.3}Sc_{0.2})_3(Al_{0.6}Sc_{0.4})_5O_{12}$ | 0.01 | Garnet |

The oxide raw materials thus obtained were carefully dispersed and mixed again in ethanol in a nylon ball mill device, preventing the contamination with each other. The treatment time was 24 hours in each case. Thereafter, a spray-drying treatment was performed to create granular raw materials all having an average grain size of 20 μm. Each of the resulting 20 types of the powder raw materials was subjected to uniaxial pressing and isostatic pressing treatment with a pressure of 198 MPa to obtain a CIP compact. The resulting compact was subjected to degreasing treatment in a muffle furnace under the conditions of 1,000° C. and two hours. Subsequently, the degreased compact was placed in an oxygen atmosphere furnace and treated at 1,730° C. for three hours to obtain a total of 18 kinds of sintered bodies. At this time, the relative densities of the sintered samples were in the range from 95% to 99.2%.

manufactured by NKT Photonics, a power meter manufactured by Gentec and a Ge photodetector, and was determined based on the following equation in accordance with JIS K7361 and JIS K7136.

Linear Transmittance(%/25 mm)=$I/I_0 \times 100$ wherein I represents the intensity of the transmitted light (the intensity of the light transmitted linearly through a sample with a length of 25 mm), and $I_0$ represents the intensity of the incident light.

(Method for Measuring Extinction Ratio)

The extinction ratio as a Faraday rotator was measured as below.

By using an optical system internally manufactured using a light source manufactured by NKT Photonics, a collimator lens, a polarizer, a work stage, an analyzer, a power meter manufactured by Gentec, and a Ge photodetector, the light with a wavelength of 1,064 nm was set at a large beam diameter of 3 mmϕ and was transmitted through the sample. The intensity $I_0$ of the light (the maximum value as the intensity of the laser light) was measured when the polarization plane of the analyzer was made to coincide with the polarization plane of the polarizer in this state. Subsequently, the intensity I' (the minimum value as the intensity of the laser light) of the received light was measured again in a state where the polarization plane of the analyzer was rotated by 90 degrees to be made orthogonal to the polarization plane of the polarizer. Then, the extinction ratio was determined by calculation based on the following equation.

$$\text{Extinction Ratio(dB)} = -10 \times \log_{10}(I'/I_0')$$

Note that the beam tail starts to be kicked at the outer periphery of the sample with a diameter of 5 mmϕ if the beam diameter is made larger than 3 mmϕ. Thus, this beam diameter of 3 mmϕ was defined as a state where the light was made incident on the entire surface of the actual work.

(Method for Measuring Volume Concentration of Scattering Sources)

The volume concentration occupied by bubbles and/or different phases in the sintered body (the volume concentration of the scattering sources) was measured as below.

By using a transmission mode of a metallographic microscope manufactured by Zeiss, a transmission open nicol image of each sintered body sample with both end faces polished as previously mentioned was captured with an objective lens magnification of 50×. The frame size at that time was about 153 μm×117 μm. A total of five transmission open nicol images were captured as the focal depth was deepened by 2 μm from this point. A typical size of the scattering sources is about 1 μm. When five images are captured while the focus is shifted by a pitch of 2 μm, almost all the scattering sources distributed in the height direction (the range of 10 μm in depth) can be photographed, ignoring slight out-of-focus.

The size of the scattering sources in the captured images is as follows: first, if there are special foreign substances and the like other than bubbles (pores) and different phases, the size (diameter) reaches several tens of micrometers. In this case, if even only one of the special foreign substance or the like is present in the image, the volume concentration of the scattering source exceeds 200 ppm, and significant scattering occurs when the laser beams hit the scattering source. Thus, the linear transmittance decreases greatly. However, the contamination by such a large scattering source did not exist.

Furthermore, the scattering source was observed more finely. As a result, it was found that the sizes of the remaining scattering sources were all photographed as substantially spherical contrasts with a diameter of 3 μm or less. Moreover, most of the contrasts were less than 1.6 μmϕ in diameter.

Note that another problem was confirmed that the size of the scattering sources of less than 150 nm in diameter does not appear in the microscope. However, for example, even if 1,100 scattering sources with a diameter of 200 nm were in the above five pictures, the total volume concentration of these scattering sources would be only less than 200 ppm by calculation. In fact, when there are many scattering sources to that extent, the value of the linear transmittance separately measured decreases greatly. Thus, the results of the observation of the volume concentration of the scattering sources by the microscope is noted as "less than 200 nm, innumerable,"

Next, for the remaining scattering sources with typical sizes, the sizes (diameters) of the scattering sources were counted by stratification at 0.5 μm pitch. That is, the numbers of scattering sources with respective sizes of ϕ0.5 μm, ϕ1 μm, ϕ1.5 μm, ϕ2 μm, ϕ2.5 μm, and ϕ3 μm were counted. Specifically, scattering sources with a diameter of 0.25 μm or more to less than 0.75 μm were counted as scattering sources with a deemed diameter of 0.5 μm. Scattering sources with a diameter of 0.75 μm or more to less than 1.25 μm were counted as scattering sources with a deemed diameter of 1 μm. Scattering sources with a diameter of 1.25 μm or more to less than 1.75 μm were counted as scattering sources with a deemed diameter of 1.5 μm. Scattering sources with a diameter of 1.75 μm or more to less than 2.25 μm were counted as scattering sources with a deemed diameter of 2 μm. Scattering sources with a diameter of 2.25 μm or more to less than 2.75 μm were counted as scattering sources with a deemed diameter of 2.5 μm. Scattering sources with a diameter of 2.75 μm or more to less than 3.25 μm were counted as scattering sources with a deemed diameter of 3 μm. Then, the scattering sources counted in each stratum of the size (diameter) of the scatter sources were regarded as spherical scattering sources of the deemed diameter. The sphere volume based on the deemed diameter was multiplied by the count number for each stratum to calculate the total volume of that stratum. The total volumes of all the stratums were added up to obtain the volume of the scattering sources. Next, this volume of the scattering sources was divided by the observation volume 179,010 μm³ (=153 μm×117 μm×10 μm) to determine the volume concentration of the scattering sources.

Subsequently, the optically polished sample was coated with an antireflection film (AR coating) designed to have a center wavelength of 1,064 nm. The optical appearance of the sample obtained herein was also checked. FIGS. 2A and 2B show the checking results of the optical appearance of the sample of Example 1 as an example. As can be seen in FIG. 2B, the appearance was transparent as seen through the optically polished surfaces. Note that the appearance looks purple due to the interference color of the AR coating.

For each sample thus obtained, the Verdet constant and the maximum change amount of the focal position by the thermal lens were measured as below. That is, as shown in FIG. 1, polarization elements (the polarizer 120, the analyzer 130) were set in front of and behind each resulting ceramic sample (corresponding to the Faraday rotator 110), respectively. This sample was inserted into the center of a neodymium-iron-boron magnet (magnet 140) with an outer diameter of 32 mm, an inner diameter of 6 mm and a length of 40 mm. Thereafter, high power laser beams with a wavelength of 1,064 nm were incident on the both end faces by using a high power laser (beam diameter: 1.6 mm) manufactured by IPG Photonics Corporation to measure the Verdet constant. Moreover, after the neodymium-iron-boron magnet was removed, high power laser beams with a wavelength of 1,064 nm were incident on each ceramic sample under the same conditions as described above. The occurrence of the thermal lens at that time was measured and evaluated as the maximum change amount of the focal position.

(Method for Measuring Verdet Constant)

A Verdet constant V was determined based on the following equation. Note that a magnitude of a magnetic field (H) applied to the sample was calculated by simulation based on the dimensions of the measurement system, a residual magnetic flux density (Br) and coercivity (He).

$\theta = V \times H \times L$ wherein $\theta$ is the Faraday rotation angle (rad), V is the Verdet constant (rad/(T·m)), H is the magnitude of the magnetic field (T), and L is the length of the Faraday rotator (0.025 m in this case).

(Method for Measuring Maximum Change Amount of Focal Position by Thermal Lens)

A spatially parallel light beam with output of 100 W was emitted by a high power laser (beam diameter: 1.6 mm) manufactured by IPG Photonics, and the focal position was measured with a beam profiler. Subsequently, the ceramic sample was set on the emitted light beam line, the focal position changed by setting the sample was measured again with the beam profiler, and the difference between the focal positions was determined as the maximum change amount of the focal position by the thermal lens.

The above results are summarized in Table 2.

Sc was doped in Example 9 (y=0.09 and z=0.2 in the formula (1)), the raw material cost increased by 1.2 times.

Furthermore, the terbium concentration was too low in Comparative Example 6 (1−x−y=0.499 in the formula (1)). As a result, the Verdet constant was lower than 30 rad/(T·m).

Further, when a further larger amount of Sc was doped as in Comparative Example 9 (y=0.2 and z=0.4 in the formula (1)), the total substitution ratio combined with Y became too high. As a result, the terbium concentration became low, and the Verdet constant was lower than 30 rad/(T·m).

In contrast, Comparative Examples 1, 3 and 4, in which no scandium was added (y=0 and z=0 in the formula (1)), and Comparative Example 2, in which the addition amount of scandium was too small (y=0 and z=0.004 in the formula (1)), each had the linear transmittance of less than 83.5%, the extinction ratio of less than 40 dB, the volume concentration of the scattering sources of more than 3 ppm, and the

TABLE 2

| | Oxide Raw Material No. | Linear Transmittance (%/25 mm) | Extinction Ratio (dB) | Volume Concentration of Scattering Sources (ppm) | Verdet Constant (rad/(T·m)) | Maximum Change Amount of Focal Position by Thermal Lens (m) | Note |
|---|---|---|---|---|---|---|---|
| Example 1 | 1 | 84.1 | 47 | 1 | 54 | 0.20 | |
| Example 2 | 2 | 84.1 | 47 | <1 | 51 | 0.13 | |
| Example 3 | 3 | 84.2 | 47 | <1 | 45 | 0.11 | |
| Example 4 | 4 | 84.3 | 48 | <1 | 40 | 0.08 | |
| Example 5 | 5 | 84.4 | 49 | <1 | 34 | 0.01 | |
| Example 6 | 6 | 84.3 | 48 | <1 | 45 | 0.10 | |
| Example 7 | 7 | 84.0 | 46 | 1 | 33 | 0.22 | |
| Example 8 | 8 | 84.1 | 47 | 1 | 44 | 0.12 | |
| Example 9 | 9 | 84.1 | 47 | <1 | 44 | 0.10 | Material Cost: 1.2 times |
| Example 10 | 10 | 84.5 | 49 | <1 | 33 | 0.03 | |
| Example 11 | 11 | 84.1 | 47 | 1 | 53 | 0.19 | |
| Comparative Example 1 | 12 | 80.1 | 33 | 17 | 58 | 0.32 | |
| Comparative Example 2 | 13 | 80.6 | 34 | 15 | 46 | 0.30 | |
| Comparative Example 3 | 14 | 82.9 | 36 | 7 | 46 | 0.27 | |
| Comparative Example 4 | 15 | 83.2 | 38 | 5 | 35 | 0.26 | |
| Comparative Example 5 | 16 | 83.3 | 39 | 4 | 56 | 0.26 | |
| Comparative Example 6 | 17 | 84.5 | 49 | <1 | 28 | 0.02 | |
| Comparative Example 7 | 18 | 83.1 | 37 | 5 | 45 | 0.27 | |
| Comparative Example 8 | 19 | 75.3 | 31 | Less than 200 nm, Innumerable | 40 | 0.66 | |
| Comparative Example 9 | 20 | 84.5 | 49 | <1 | 29 | 0.03 | |

From the above results, the group of all Examples (Examples 1 to 11) managed by the complex oxide composition of the present invention and Comparative Examples 6 and 9 each had the linear transmittance of 83.5% or more, the extinction ratio of 40 dB or more, and the volume concentration of the scattering sources of 3 ppm or less, and it was confirmed that paramagnetic garnet-type transparent ceramic sintered bodies with high transparency were created. Moreover, the maximum change amounts of the focal position by the thermal lens (the generation amount of the thermal lens) were all suppressed to 0.25 m or less when the laser light with the input power of 100 W was input thereto, and it was confirmed that the ceramics can be mounted in a high power laser system. However, since a larger amount of maximum change amount of the focal position by the thermal lens (generation amount of the thermal lens) of more than 0.25 m when the laser light with the input power of 100 W was input thereto, resulting in the deterioration of the optical quality.

In Comparative Example 5, considerably good properties were obtained. However, the substitution amount by yttrium was somewhat insufficient (x=0.001 in the formula (1)), and the values of the linear transmittance, the extinction ratio, the volume concentration of the scattering sources, and the maximum change amount of the focal position by the thermal lens (generation amount of the thermal lens) were inferior to those of the group of Examples. As for Comparative Example 7, good properties to some extent were also obtained. However, the doping amount of $SiO_2$ was too large, and the values of the linear transmittance, the extinction ratio, the volume concentration of the scattering sources, and the maximum change amount of the focal position by the thermal lens (generation amount of the thermal lens) were inferior to those of the group of Examples.

When the compounding ratio of the rare earth site to the aluminum site was deviated from the stoichiometric ratio as in Comparative Example 8, the values of the linear transmittance, the extinction ratio, the volume concentration of the scattering sources, and the maximum change amount of the focal position by the thermal lens (generation amount of the thermal lens) were remarkably worsened from those of the group of Examples.

As described above, according to the results of Examples, by managing x, y and z in the formula (1) in predetermined ranges and doping $SiO_2$ as a sintering aid in a predetermined range, it is possible to provide a paramagnetic garnet-type transparent ceramic with low scattering and high transparency, in which the linear transmittance at a wavelength of 1,064 nm for an overall length of 25 mm is 83.5% or more, the Verdet constant at a wavelength of 1,064 nm is 30 rad/(T·m) or more, the maximum change amount of the focal position by the thermal lens (generation amount of the thermal lens) is 0.25 m or less when the laser light with the input power of 100 W, a wavelength of 1,064 nm and the optical path length of 25 mm is input thereto, the extinction ratio at a wavelength of 1,064 nm as a Faraday rotator is 40 dB or more, and the volume concentration of the scattering sources is 3 ppm or less. In addition, when this transparent ceramic is used as a magneto-optical material, it is possible to provide a high-performance magneto-optical device usable even for high power applications.

Note that, although the present invention has been described with reference to the above embodiments so far, the present invention is not limited to these embodiments and can be changed within a scope that a person skilled in the art can conceive, such as other embodiments, additions, modifications and deletions, and any aspects are included in the scope of the present invention as long as the effects of the present invention are exerted.

Japanese Patent Application No. 2018-096086 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A paramagnetic garnet-type transparent ceramic that is a sintered body of complex oxide represented by the following formula (1), comprising $SiO_2$ as a sintering aid in an amount of more than 0% by weight to 0.1% by weight or less, and has a linear transmittance of 83.5% or more at a wavelength of 1,064 nm for an optical path length of 25 mm:

$$(Tb_{1-x-y}Y_xSc_y)_3(Al_{1-z}Sc_z)_5O_{12} \quad (1)$$

wherein $0.05 \leq x < 0.45$, $0 < y < 0.1$, $0.5 < 1-x-y < 0.95$, and $0.004 < z < 0.2$.

2. The paramagnetic garnet-type transparent ceramic according to claim 1, wherein a Verdet constant at the wavelength of 1,064 nm is 30 rad/(T·m) or more.

3. The paramagnetic garnet-type transparent ceramic according to claim 1, wherein a maximum change amount of a focal position by a thermal lens is 0.25 m or less when laser light with the wavelength of 1,064 nm is input thereto with a beam diameter of 1.6 mm and input power of 100 W, for the optical path length of 25 mm.

4. The paramagnetic garnet-type transparent ceramic according to claim 1, wherein an extinction ratio at the wavelength of 1,064 nm for the optical path length of 25 mm is 40 dB or more as a Faraday rotator.

5. The paramagnetic garnet-type transparent ceramic according to claim 1, wherein a volume concentration of a scattering source is 3 ppm or less.

6. A magneto-optical material made of the paramagnetic garnet-type transparent ceramic according to claim 1.

7. A magneto-optical device configured by using the magneto-optical material according to claim 6.

8. The magneto-optical device according to claim 7, comprising the paramagnetic garnet-type transparent ceramic as the Faraday rotator, wherein the magneto-optical device is an optical isolator which includes a polarization material in front of and behind the Faraday rotator on an optic axis and is usable at a wavelength band of 0.9 μm or more to 1.1 μm or less.

* * * * *